US006849132B2

(12) United States Patent
Warnes et al.

(10) Patent No.: US 6,849,132 B2
(45) Date of Patent: Feb. 1, 2005

(54) CVD CODEPOSITION OF Al AND ONE OR MORE REACTIVE (GETTERING) ELEMENTS TO FORM PROTECTIVE ALUMINIDE COATING

(75) Inventors: Bruce M. Warnes, Muskegon, MI (US); David C. Punola, Muskegon, MI (US); Jeffery S. Smith, Muskegon, MI (US); Daniel L. Near, Montague, MI (US)

(73) Assignee: Howmet Research Corporation, Whitehall, MI (US)

( * ) Notice: Subject to any disclaimer, the term of this patent is extended or adjusted under 35 U.S.C. 154(b) by 0 days.

(21) Appl. No.: 10/645,292

(22) Filed: Aug. 20, 2003

(65) Prior Publication Data

US 2004/0038069 A1 Feb. 26, 2004

Related U.S. Application Data

(62) Division of application No. 08/197,497, filed on Feb. 16, 1994, now Pat. No. 6,689,422.

(51) Int. Cl.[7] .............................................. C23C 10/28
(52) U.S. Cl. ................................ 118/715; 118/723 VE; 118/717
(58) Field of Search ........................ 118/715, 723 VE, 118/717

(56) References Cited

U.S. PATENT DOCUMENTS 2,772,985 A   12/1956   Wainer ............................ 117/1
3,486,927 A   12/1969   Gauje ......................... 117/107.2
3,544,348 A   12/1970   Boone ............................. 117/2
3,951,642 A   4/1976    Chang et al. ................. 427/253
3,961,098 A   6/1976    Bessen ........................... 427/34
4,070,507 A   1/1978    Stueber et al. ............... 427/252
4,132,816 A   1/1979    Benden et al. ............... 427/237
4,676,994 A   6/1987    Demaray ........................ 427/42
4,687,684 A   8/1987    Restall et al. .............. 427/248.1
4,698,244 A   10/1987   Benander et al. ............ 427/253
4,701,384 A   10/1987   Sarin et al. .................. 428/688
4,702,970 A   10/1987   Sarin et al. .................. 428/688
4,745,010 A   5/1988    Sarin et al. .................. 427/255
4,751,109 A   6/1988    Sarin et al. .................. 427/255
4,758,451 A   7/1988    Van den berg et al. ...... 427/249
4,835,011 A   5/1989    Olson et al. ................. 427/253
4,844,951 A   7/1989    Sarin et al. .................. 429/255
4,890,574 A   1/1990    Sarin et al. .................. 118/719
4,931,425 A   6/1990    Kimura et al. ............. 427/255.3
4,943,450 A   7/1990    Sarin ......................... 427/255.2
5,015,502 A   5/1991    Strangman et al. .......... 427/248.1
5,057,196 A   10/1991   Creech et al. ............... 204/181.5
5,071,678 A   12/1991   Grybowski et al. .......... 427/253
5,147,683 A   9/1992    Tanaka et al. ............... 427/253
5,149,514 A   9/1992    Sanjurjo ....................... 423/344
5,264,245 A   11/1993   Punola et al. ................ 427/237
5,275,840 A   1/1994    Mikami et al. ................. 427/66

*Primary Examiner*—Laura Edwards
(74) *Attorney, Agent, or Firm*—Edward J. Timmer

(57) ABSTRACT

CVD aluminide coatings including a small concentration of a reactive, gettering element for surface active impurities dispersed therein are formed for improved oxidation resistance. The aluminide coatings are formed by CVD codeposition of Al and the gettering element on the substrate using coating gases for the gettering element generated either outside or inside the coating retort depending on the chlorination temperature needed for the particular gettering element.

10 Claims, 7 Drawing Sheets

CVD CODEPOSITION OF Al AND ONE OR MORE REACTIVE (GETTERING) ELEMENTS TO FORM PROTECTIVE ALUMINIDE COATING

This application is a division of Ser. No. 08/197,497 filed Feb. 16, 1994, now U.S. Pat. No. 6,689,422.

FIELD OF THE INVENTION

The present invention relates to the chemical vapor codeposition of multiple elements and particularly of aluminum and one or more active (gettering) elements, such as Hf, Zr, Y, to form a protective aluminide coating bearing the active (gettering) element on a substrate in effective amount to improve coating oxidation/corrosion resistance.

BACKGROUND OF THE INVENTION

It is well known to improve the oxidation and/or corrosion resistance of various nickel, cobalt and/or iron base superalloy gas turbine engine components by forming a protective aluminide diffusion coating thereon. One coating process used to form aluminide coatings on superalloy substrates involves a pack process (pack cementation) wherein the substrate to be coated is placed in a particulate bed of coating material (e.g. aluminum particulates, halide activator, and inert diluent) and heated in a retort to an elevated coating temperature to generate an aluminum halide coating gas that reacts with one or more substrate elements (e.g. Ni for a nickel base superalloy substrate) to form the aluminide coating (e.g. nickel aluminide) on the substrate. U.S. Pat. Nos. 3,544,348, 3,961,098, 4,070,507, and 4,132,816 disclose pack coating processes for forming aluminide coatings.

Another coating process used to form aluminide coatings on superalloy substrates involves a chemical vapor deposition process (CVD process) wherein the substrate to be coated is placed in a reactor, heated to elevated coating temperature, and a coating gas comprising aluminum halide (e.g. Al trichloride or subchlorides) and a carrier gas, such as hydrogen, is introduced to the reactor to deposit aluminum on the substrate for reaction therewith to form the aluminide coating thereon. The Gauje U.S. Pat. No. 3,486,927 represents an early effort directed to a CVD coating process.

The CVD process can be used to form aluminide coatings including additional alloying elements in the coating. For example, U.S. Pat. No. 2,772,985 discloses formation of binary Al—B, Al—Si, Al—Ti, and Al—Zr coatings on Mo substrates. The patented process first vapor phase deposits Al on the Mo substrate and then reacts the deposited Al with the alloying element (B, Si, Ti or Zr) deposited from a second coating gas. The aluminum halide coating gas and alloying element halide coating gas are generated in separate parallel generators to provide separate coating gas streams. The process does not involve codeposition of the coating elemental constituents on the substrate.

U.S. Pat. No. 4,687,684 relates to CVD formation of oxidation resistant Si and Cr-enriched aluminide diffusion coatings on a superalloy substrate. The patent provides for sequential introduction of the aluminum halide coating gas and the silicon or chromium halide coating gas to the coating reactor. The patent does not involve codeposition of the coating elemental constituents on the substrate.

U.S. Pat. No. 5,015,502 discloses a CVD coating process for forming aluminide coatings containing a gettering element (e.g. Y) by chlorination of a source of aluminum containing Y and one or more of Si, Cr, Co, etc. A preferred source is described as an Al—Y—Si alloy.

Aluminum and silicon have been intermittently codeposited on a heated superalloy substrate by CVD such that a silicon-modified aluminide coating is formed. In particular, low silicon contents of trace to 8 weight % are desirable to improve the oxidation/corrosion resistance of the aluminide coating. Since typical silicon precursors, such as silicon tetrachloride and dichlorosilane, are much less stable than aluminum trichloride, a short pulse (e.g. 7.5 minutes) of the silicon halide or silane coating gas is provided intermittently (e.g. once every two hours) during the continuous CVD aluminum deposition to obtain the desired silicon concentration in the coating. Since no intermetallic compounds form between aluminum and silicon and the coating is applied at high temperature, silicon can be deposited on the substrate from pulses of silicon tetrachloride or dichlorosilane and then it diffuses during the aluminizing cycle to give a homogenous silicon modified aluminide coating.

If Al and a reactive element (such as Hf, Zr and Y) which form stable intermetallic compounds with Si are continuously codeposited while Si is intermittently codeposited by the aforementioned CVD pulsing technique, then the resulting modified aluminide coating will be heterogenous in that the pulses of silicon coating gas produce layers in the coating that contain a large volume fraction of silicon rich intermetallic compounds.

Such a coating structure wherein the majority of the reactive element (gettering/active element) exist as intermetallic compound layers does not exhibit the superior oxidation resistance of a modified aluminide coating wherein the reactive element is uniformly dispersed throughout the aluminide coating.

Thus, there is a need for the continuous deposition of aluminum and a reactive element, such as Hf, Zr, and/or Y, with or without Si to obtain a more homogenous coating for oxidation resistance.

It is an object of the invention to provide a CVD method and apparatus for codepositing multiple elements on a substrate in a manner to overcome disadvantages discussed above.

It is another object of the invention to provide a CVD coating method and apparatus for forming aluminide coatings wherein aluminum and one or more reactive elements for surface active superalloy substrate impurities (e.g., S, P, etc.) are codeposited on a substrate.

It is still another object of the invention to provide a CVD coating method and apparatus for forming an aluminide coating including silicon and one or more reactive elements for surface active superalloy substrate impurities wherein aluminum, silicon and the reactive element(s) (e.g. Hf, Zr, Y) are codeposited on the substrate.

It is still a further object of the invention to provide a coated superalloy article having an aluminide coating thereon including one or more reactive elements for surface active superalloy substrate impurities uniformly distributed in a region of the coating or throughout the coating for improved oxidation resistance.

SUMMARY OF THE INVENTION

The present invention provides in one embodiment method/apparatus for forming on a substrate a chemical vapor deposited (CVD'ed) aluminide coating including one or more reactive elements, such as Hf, Zr, and Y, dispersed therein by virtue of codeposition of Al and the reactive element(s) during CVD coating. In a particular embodiment of the invention wherein the reactive element, such as Hf and Zr, can be halogenated (e.g. chlorinated) at relatively low temperatures (e.g. less than 600° C.), the invention comprises flowing a first halide precursor gas in a carrier gas in contact with a first source comprising aluminum disposed outside a coating retort to generate an aluminum halide first coating gas, flowing a second halide precursor gas in an inert carrier gas in contact with a second source comprising a reactive element (e.g. Hf or Zr) disposed outside the coating retort to generate a second halide coating gas of the reactive element, and introducing the first and second coating gases concurrently into a coating retort in which the substrate at elevated temperature is disposed to codeposit Al and the reactive element on the substrate for coating formation.

The first coating gas preferably is formed by flowing hydrogen chloride in a hydrogen carrier gas in contact with Al particulates heated to a reaction temperature to form aluminum trichloride. The second coating gas preferably is formed by flowing hydrogen chloride in an inert carrier gas in contact with particulates comprising an a reactive element selected from the group consisting essentially of Hf and Zr heated to a reaction temperature to form the tetrachloride thereof.

In another particular embodiment of the invention wherein the reactive element, such as Y, can be halogenated (e.g. chlorinated) only at relatively high temperatures (e.g. greater than 600° C.), the invention comprises flowing a halide precursor gas in a carrier gas in contact with a first source comprising aluminum disposed outside a coating retort to generate an aluminum halide coating gas, flowing the first coating gas into the coating retort in contact with a second source comprising a reactive element (e.g. Y) disposed inside the retort and heated to the necessary reaction temperature to convert a portion of the first coating gas to a halide coating gas of the reactive element, and contacting the coating gases concurrently with the substrate at elevated temperature in the retort to codeposit Al and the reactive element on the substrate for coating formation.

In this embodiment of the invention, prior to contacting the substrate, the unconverted portion of the first coating gas is flowed in contact with a secondary source comprising an aluminum alloy in the coating retort to increase the activity of aluminum therein. For example, the first coating gas can comprise aluminum trichloride in a hydrogen/inert carrier gas. The activity of aluminum in the unconverted portion of the first coating gas is increased by forming aluminum subchlorides by contact with a secondary source comprising an aluminum alloy (e.g. Al—Co or Al—Cr) in the retort downstream of the gettering element source. This provides the desired amount of Al deposition on the substrate.

In this embodiment of the invention, the first coating gas can include a tetrachloride of the reactive element (such as hafnium or zirconium tetrachloride) generated outside the coating retort so as to codeposit two reactive elements on the substrate.

Also in this embodiment of the invention, a silicon halide coating gas can be introduced into the coating retort in a manner to by-pass the reactive element source so as to concurrently contact the substrate with the other coating gases present to codeposit Al, Si, and the reactive element(s) on the substrate for coating formation.

The present invention provides in a further embodiment method/apparatus for codepositing first and second elements on a substrate. This embodiment involves flowing a halide precursor gas in a carrier gas in contact with a first source comprising a first element disposed outside a coating retort to generate a first halide coating gas, flowing the first coating gas into the coating retort in contact with a second source comprising a second element disposed inside the coating retort to convert a portion of the first coating gas to a halide coating gas of the second element, and contacting the first and second coating gases concurrently with the substrate at elevated temperature in the coating retort to codeposit the first and second elements on the substrate.

The present invention provides a coated substrate comprising a substrate and a CVD'ed aluminide diffusion coating thereon having a dispersion of one or more reactive elements (e.g. Hf, Zr, Y) in a region (e.g. inner coating region or outer coating region) or throughout the entire coating by virtue of the reactive element(s) being codeposited with aluminum on the substrate. The aluminide coating also may include Si uniformly distributed therein by codepositon with Al and the reactive element(s).

The aforementioned objects and advantages of the present invention will become more readily apparent from the following detailed description of the invention taken with the following drawings.

DETAILED DESCRIPTION

FIGS. 1–6 illustrate CVD coating apparatus in accordance with illustrative embodiments of the invention for forming a CVD aluminide coating including an effective concentration of one or more reactive elements (gettering/active elements) for surface active substrate impurities (e.g. S, P, etc.) dispersed uniformly at a region or throughout the coating to improve oxidation/corrosion (sulfidation) resistance. By reactive element for surface active substrate impurities is meant a coating alloying component that readily combines with surface active elements (such as S, P, etc.) from the substrate to tie up these elements as a compound and prevent migration thereof to the coating/outer oxide interface where surface active substrate impurities are known to reduce coating life in elevated temperature oxidation and corrosion tests. Known reactive (gettering/active) elements used heretofore in aluminide coatings to this end are selected from the group consisting essentially of Hf, Zr and Y.

The present invention provides a method and apparatus for CVD codeposition on a substrate to be protectively coated of Al and one or more of reactive elements for surface active substrate impurities in a manner that the reactive element(s) is/are distributed uniformly at a particular region (e.g. inner coating region proximate the substrate or outer coating region remote from the substrate) or throughout the coating thickness without layering so as to improve coating oxidation/corrosion resistance. FIGS. 1–6 are offered for purposes of illustrating, but not limiting, the invention to this end.

Figure 1:
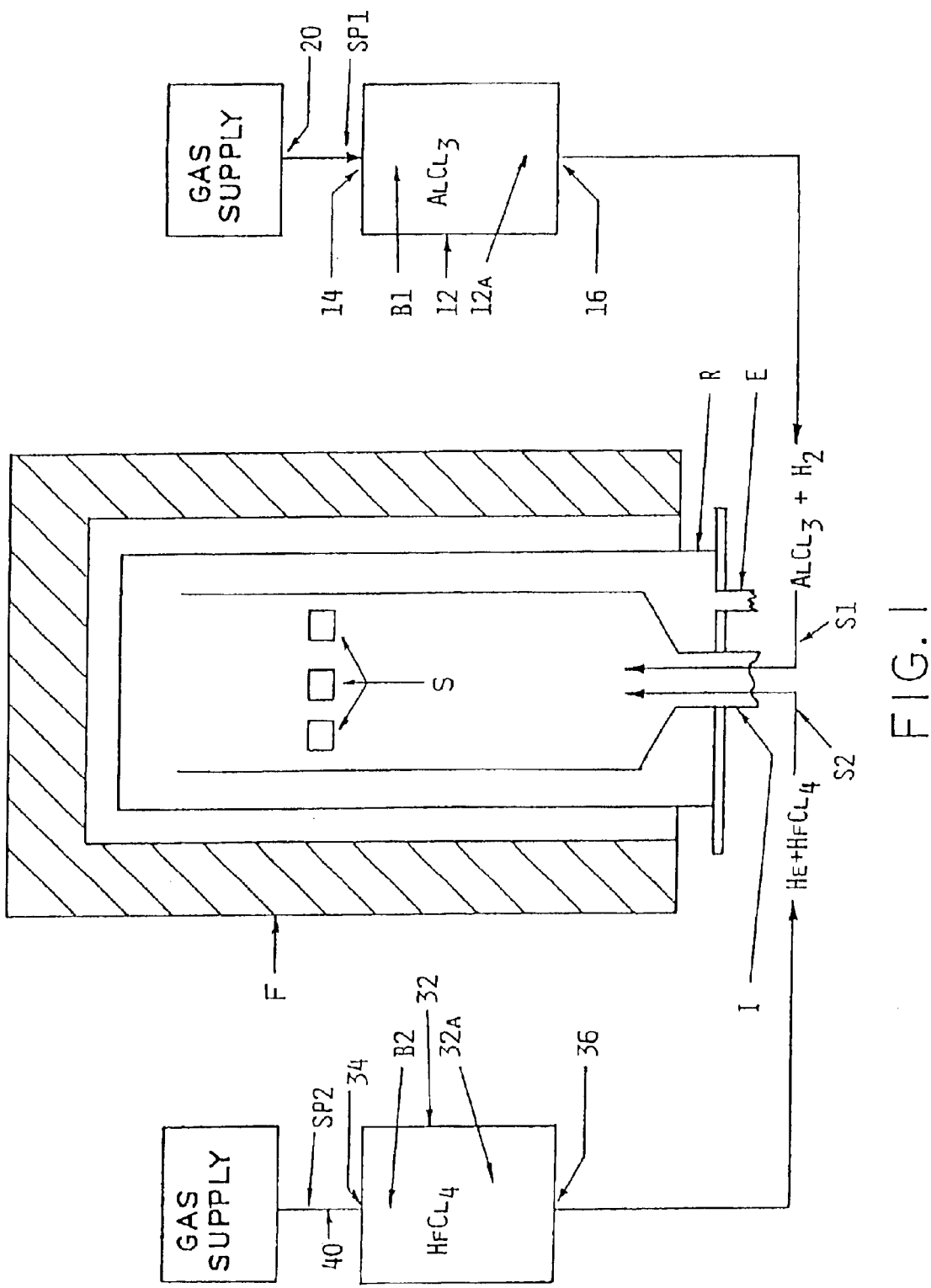
FIG. 1 is a schematic view of CVD coating apparatus for forming an aluminide coating including a reactive element, such as for example Hf or Zr, for surface active substrate impurities using coating gases generated by chlorination at a relatively low temperature outside the retort in accordance with one embodiment of the invention.

FIG. 1 illustrates one embodiment of the invention wherein the CVD coating gases for codepositing Al and a reactive element are generated at relatively low halogenation (e.g. chlorination) temperatures outside of the coating reactor or retort R disposed within furnace F. CVD aluminide coatings generally comprising Al—Hf, Al—Hf—Si, Al—Zr, Al—Zr—Si, and Al—Hf—Si—Zr can be formed by this embodiment on substrates since the aluminum trichloride and tetrachloride of Hf, Si, and/or Zr can be formed at temperatures less than 600° C. achievable outside the coating retort R.

For purposes of illustration and not limitation, the coating retort R of FIG. 1 is illustrated as receiving two coating gas streams S1 and S2. Stream S1 comprises aluminum trichloride in a hydrogen carrier gas for depositing Al on the substrates S disposed in the retort R. Stream S2 comprises hafnium tetrachloride in a He (or other inert gas) carrier gas for depositing Hf on the substrates S concurrently with the Al from stream S1.

To this end, the CVD coating apparatus is shown comprising a coating gas generator housing 12 having a reaction chamber 12a with an inlet 14 and outlet 16. Disposed in the reaction chamber 12a is a source of aluminum, such a bed B1 of aluminum particulates (Alcoa Granny P pellets). The generator housing 12 is heated by electric resistance heating to provide a desired reaction temperature (e.g. 290° C.) therein to effect the desired reaction between the aluminum source and the precursor gas stream SP1. In the illustrative embodiment of FIG. 1, the precursor halide gas stream SP1 comprises ultra high purity hydrogen carrier gas and hydrogen chloride gas supplied from respective conventional bulk supply ($H_2$) and cylinder (HCl)(not shown) to a common supply conduit 20 where they are mixed uniformly. The hydrogen chloride typically comprises about. 1 to about 20 volume % of the precursor gas stream SP1, the balance being hydrogen. The ratio of HCl/hydrogen and flow rate of the precursor gas stream SP1 is adjusted to provide complete conversion of the hydrogen chloride to $AlCl_3$ at 290° C. in the hydrogen carrier gas. Typically, the $AlCl_3$ gas comprises 1 to 10 volume % of the coating gas stream S1. Stream S1 is introduced into the retort R via inlet I so as to contact the substrates S disposed therein.

The coating apparatus also is shown comprising a coating gas generator housing 32 having a reaction chamber 32a with an inlet 34 and outlet 36. Disposed in the reaction chamber 32a is a source of hafnium, such a bed B2 of hafnium particulates (pellets) having a size range of greater than ¼ inch to less than ⅝ inch. The generator housing 32 is heated by electric resistance heating to provide a desired reaction temperature (e.g. 430° C.) therein to effect the desired reaction between the hafnium source and the precursor gas stream SP2. In the illustrative embodiment of FIG. 1, the precursor halide gas stream SP2 comprises ultra high purity helium (or other inert gas) carrier gas and hydrogen chloride gas supplied from respective conventional bulk supply (inert) and cylinder (HCl) (not shown) to a common supply conduit 40 where they are mixed uniformly. The hydrogen chloride typically comprises about 4 to about 70 volume % of the precursor gas stream SP2, the balance being inert gas. The ratio of HCl/inert gas and flow rate of the precursor gas stream SP2 is adjusted to provide complete conversion of the hydrogen chloride to $HfCl_4$ at 430° C. in the inert carrier gas. Typically; the $HfCl_4$ gas comprises 1–5 volume % of the coating gas stream S2. The carrier gas for stream S2 comprises an inert gas since Hf (and other of the aforementioned gettering elements) form hydrides by exothermic reactions. The inert carrier gas avoids formation of such hydrides.

Coating gas stream S2 is introduced into the retort R via inlet I concurrently with stream S1 so as to contact the substrates S disposed therein and heated to an elevated coating temperature, whereby Al and Hf are codeposited on the substrates S and form an aluminide diffusion coating including Hf uniformly dispersed therein by virtue of the Al and Hf being codeposited. Flow of the coating gas streams S1, S2 can be controlled as desired to form a tailored coating wherein the reactive element is uniformly dispersed at an inner coating region, outer coating region, or throughout the central coating thickness. The substrates are heated to an elevated coating temperature, such as about 1100° C. for a nickel base superalloy. Spent coating gases are removed from the retort via exhaust E.

By adjusting the partial pressure of the $HfCl_4$ in the CVD retort R, the relative concentrations of Al and Hf in the CVD coating can be varied between, for example, 25 to 30 weight Al and trace to 5.0 weight % Hf. For example, aluminide coatings including 0.2, 0.427, 1.2, 1.9, and 2.51 weight % Hf (as determined by electron microprobe analysis of the CVD coatings) uniformly dispersed therein have been formed on PWA 1480, PWA 1484, Rene 80, Rene 41 and IN738 nickel base superalloy substrates.

Coating times at substrate temperatures of 1080° C. of 10 to 20 hours were used. The streams S1, S2 were flowed axially past the substrates in the manner illustrated in FIG. 1 in some coating trials and also radially past the substrates in the manner illustrated in U.S. Pat. No. 5,264,245 in other coating trails.

The invention was effective to codeposit Al and Hf on the substrates in a manner to form a CVD aluminide diffusion coating having a uniformly distributed concentration of Hf throughout the coating for improved cyclic oxidation resistance compared to a simple aluminide coating without Hf therein (e.g. 2 to 7 times better cyclic oxidation resistance)

as determined by cylic oxidation tests. A one hour testing cycle included 50 minutes at 1100° or 1177° C. and 10 minutes cooling to room temperature. Specimen weight change was measured after every 50 such cycles.

Similarly, Al and Zr can be codeposited on substrates to form a CVD aluminide diffusion coating having a uniformly distributed concentration of Zr at a particular coating region or throughout the coating for improved cyclic oxidation resistance (e.g. 2 to 5 times better) than a simple aluminide coating. For example, a bed of Zr pellets having a size range of greater than ¼ inch to less than ⅝ inch can be disposed in the generator 32 in lieu of the Hf pellets. The generator housing 32 is heated a reaction temperature of 430° C. to effect the desired reaction between the Zr source and the precursor gas stream SP2, which comprises ultra high purity helium (or other inert gas) carrier gas and hydrogen chloride gas supplied from respective bulk supply (He) and cylinder (HCl) (not shown) to the common supply conduit 40 where they are mixed uniformly. The ratio of HCl/He and flow rate of the precursor gas stream SP2 are adjusted to provide complete conversion of the hydrogen chloride to $ZrCl_4$ at 430° C. in the He carrier gas. Typically, the $ZrCl_4$ gas comprises 1 to 5 volume % of the coating gas stream S2. The carrier gas for gas stream SP2 and thus S2 comprises an inert gas since Zr also forms hydrides by exothermic reactions.

The coating gas streams S1 ($AlCl_3$/hydrogen) and S2 ($ZrCl_4$/He) are introduced into the retort R via inlet I to contact the aforementioned heated substrates S disposed, whereby Al and Zr are codeposited on the substrates S and form an aluminide diffusion coating including Zr uniformly dispersed therein by virtue of the Al and Zr being codeposited.

By adjusting the partial pressures of the $ZrCl_4$ in the CVD retort R, the relative concentrations of Al and Zr in the CVD coating can be varied. For example, aluminide coatings including 0.093; 0.14; 0.17; 0.20; 0.399; 0.473 and 0.874 weight % Zr (as determined electron microprobe analysis of the CVD coatings) uniformly distributed therein have been formed on nickel base superalloy substrates.

Figure 2:
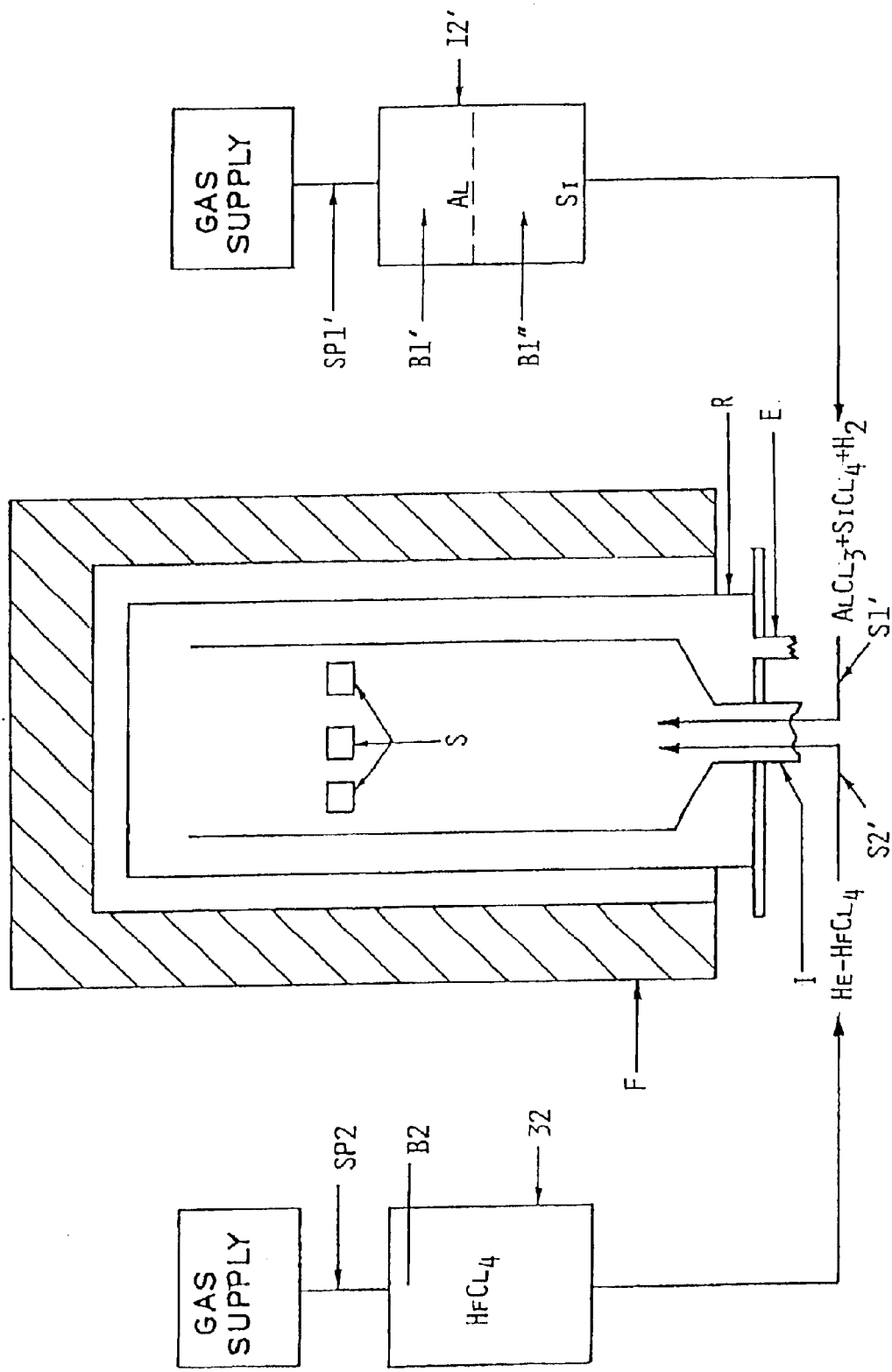
FIG. 2 is a schematic view of a CVD coating apparatus for forming an aluminide coating including Si in addition to the reactive element in accordance with another embodiment of the invention.

FIG. 2 illustrates the coating retort R as receiving two coating gas streams S1' an S2' wherein stream S1' comprises aluminum trichloride and silicon tetrachloride in a hydrogen carrier gas for codepositing Al and silicon on the substrates S disposed in the retort R. Stream S2' corresponds to stream S2 described above for depositing Hf on the substrates S. Thus, the apparatus of FIG. 2 is effective to codeposit Al, Si and Hf on the substrates S.

The coating apparatus of FIG. 2 differs from that of FIG. 1 in using a coating gas generator 12' in which a bed B1' of Al pellets (size range greater than ¼ inch to less than ½ inch) and bed B1" of Si pellets (size range greater than ¼ inch to less than 1 inch) are sequentially disposed (Si pellets downstream from the Al pellets) and the flow rate of the precursor gas stream SP1' is controlled so that the precursor halide gas stream first contacts the Al pellets to form a relatively thermodynamically stable aluminum halide coating gas and then contacts the Si pellets to form a less thermodynamically stable silicon halide coating gas.

The generator housing 12' is heated to provide a desired reaction temperature (e.g. 290° C.) to effect the desired reaction between the aluminum pellets (Al source) and the silicon pellets (Si source) with the precursor halide gas stream (HCl/hydrogen). The total flow rate of the precursor stream is controlled to leave a minor portion of the HCl available after the bed B1' for reaction with the silicon pellets in the reaction chamber to form a small quantity of silicon tetrachloride.

Generally, the total flow rate of the precursor halide gas stream is controlled to provide a coating gas stream S1' comprising 1 volume % or less of silicon tetrachloride, 1 to 10 volume % aluminum trichloride and the balance hydrogen. When such a coating gas stream S1' contacts a heated substrate in a CVD retort, Al and Si will be codeposited thereon and incorporated into the aluminide diffusion coating formed thereon. The cogeneration and codeposition of Al and Si in this marnier is described further in copending application entitled COGENERATION OF Al AND Si COATING GASES AND CVD CODEPOSITION THEREOF TO FORM Si-BEARING ALUMINIDE COATING (attorney docket no. Howmet 344) Ser. No. 08/197,478 filed Feb. 16, 1994, now abandoned. The cogeneration and codeposition of Al and Si in this manner is effective to form aluminide coatings having up to 9 weight % Si distributed uniformly therein.

By adjusting the partial pressures of the $SiCl_4$ and $HfCl_4$ in the CVD retort R, the relative concentrations of Si and Hf in the CVD coating can be varied. For example, aluminide diffusion coatings including typically 23 weight % Al with 5.5 weight % Hf and 0.29 weight % Si, 4.3 weight % Hf and 0.3 weight % Si, 0.66 weight % Si and 0.27 weight % Si, 0.55 weight % Hf and 0.1 weight % Si, and 0.38 weight Hf and 0.1 weight % Si (as determined by electron microprobe analysis of the CVD coatings) uniformly dispersed therein have been formed on PWA 1480, PWA 1484, Rene 80, Rene 41 and IN738 nickel base superalloy substrates after 10 to 20 hours at 1080° C. in the retort R.

Similarly, Al, Si, and Zr can be codeposited on substrates to form a CVD aluminide coating having a uniformly distributed concentration of Si and Zr at a particular coating region or throughout the coating for improved cyclic oxidation resistance. In particular, the coating gas stream S2' will comprise the aforementioned $ZrCl_4$ in a carrier gas in lieu of the $HfCl_4$ in carrier gas. CVD aluminide diffusion coatings including typically 23 weight % Al with 0.15 weight % Zr and 0.1 weight % Si and 0.1 weight % Zr and 0.1 weight % Si as determined by electron microprobe analysis have been formed on the nickel base superalloy substrates after 10 to 20 hours at 1080° C. in the retort R.

Since hafnium and zirconium form stable silicides, it is necessary to provide continuous deposition on the substrate of silicon to obtain a uniform distribution of hafnium and/or zirconium and silicon in the aluminide coating. The invention provides such continuous codeposition of hafnium and/or zirconium along with silicon to achieve uniform distribution of hafnium and/or zirconium suicides in the aluminide coating for improved oxidation resistance.

In addition to the aluminide coatings described above, other aluminide coatings can be formed in accordance with the aforementioned embodiment of the invention. For example, since Hf and Zr can be chlorinated under the same or similar generator conditions, aluminide coatings including both Hf and Zr can be formed; e.g. Al—Hf—Zr and Al—Hf—Zr—Si coatings can be formed pursuant to this embodiment of the invention. In particular, both hafnium and zirconium can be included in the aluminide coating by generating a coating gas stream including both $HfCl_4$ and $ZrCl_4$ and introducing it to the CVD retort R along with the coating gas stream S1 or S1'. Such a coating gas stream for Zr and Hf can be obtained by: chlorinating an appropriate Hf—Zr solid solution alloy in the generator housing 32, chlorinating the pure metals in separate external generators, or by cogenerating the metal halides in the manner described above for Al and Si. The cogeneration technique can be used when the metal forming the more stable halide (e.g. Hf) is positioned in bed B1' and the metal forming the other less stable halide (e.g. Zr) is positioned in bed B1".

Figure 3:
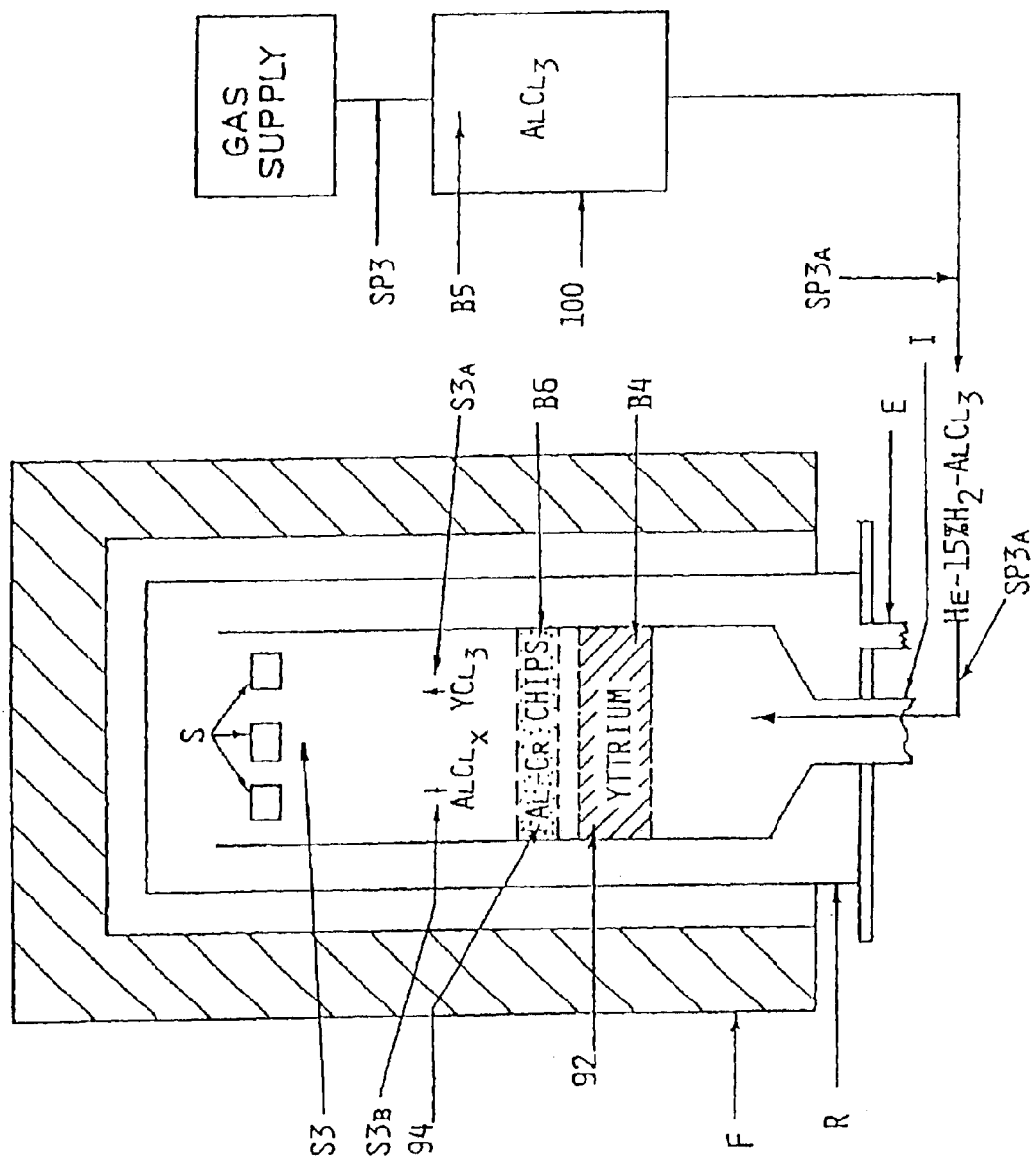
FIG. 3 is a schematic view of CVD coating apparatus for forming an aluminide coating including a reactive element using a coating gas for the gettering element generated by chlorination at higher temperatures inside the retort in accordance with still another embodiment of the invention.
Figure 4:
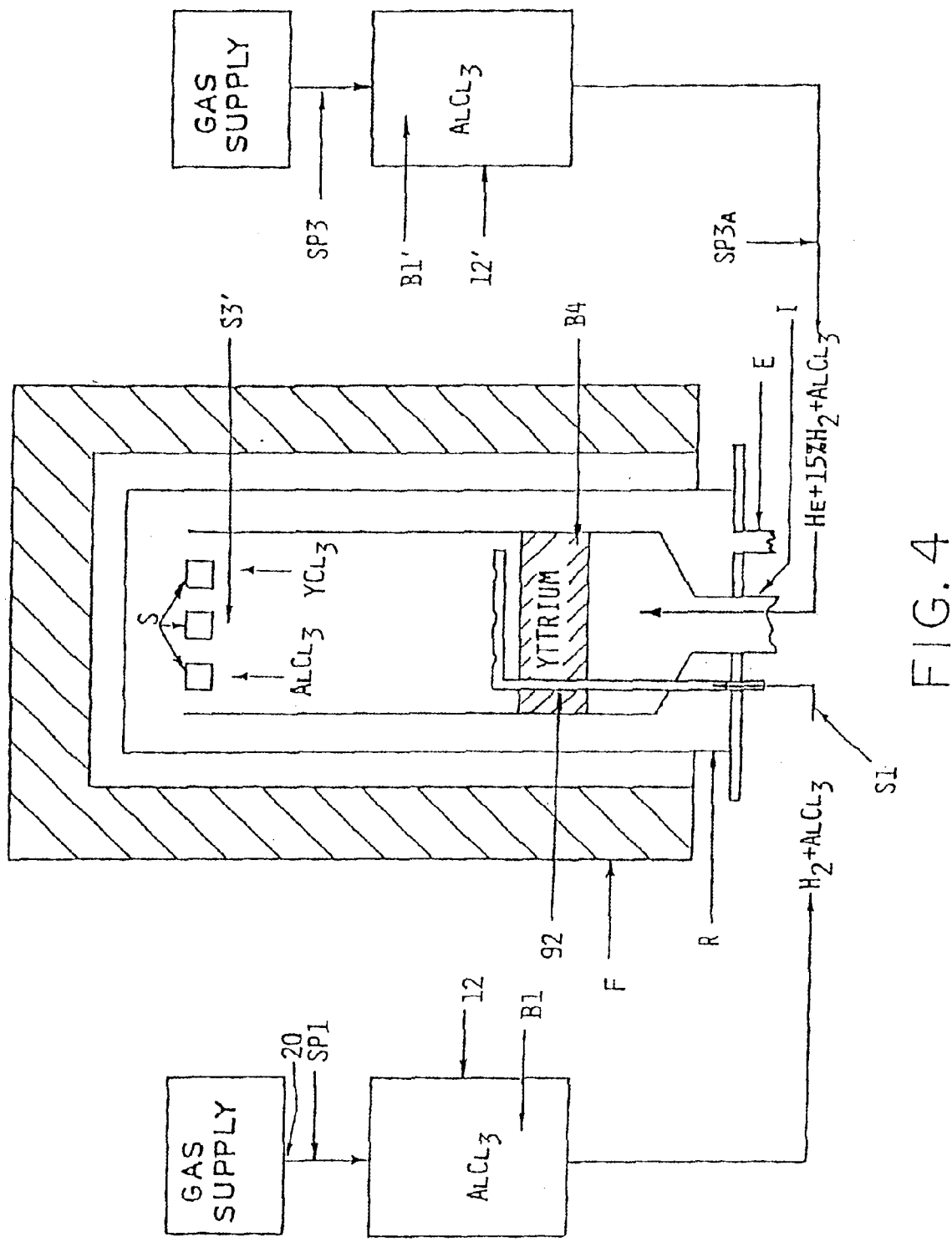
FIG. 4 is a schematic view of CVD coating apparatus for forming an aluminide coating including a reactive element using a coating gas for the active/gettering element generated by chlorination at higher temperatures inside the retort in accordance with an alternative embodiment of the invention.

FIGS. 3 and 4 illustrate coating apparatus in accordance with another embodiment of the invention for forming a CVD aluminide diffusion coating by codepositing Al and one or more reactive elements that are generated at relatively high halogenation (e.g. chlorination) temperatures (e.g. greater than 600° C. maintained inside of the coating reactor or retort R. CVD aluminide coatings generally comprising Al—Y, Al—Hf—Y, Al—Zr—Y, Al—Si—Y, and Al—Hf—Zr—Si—Y can be formed by this embodiment on substrates since yttrium tetrachloride can be formed only at temperatures greater than 900° C. (e.g. 1080° C.) achievable inside the coating retort R.

In particular, in these further embodiments of the invention, the substrates S are contacted in the CVD reactor or retort R with a coating stream S3 generated inside the retort R itself to codeposit Al and a gettering element, such as Y, on the heated substrates.

In the embodiment of the invention illustrated in FIG. 3, the yttrium trichloride coating gas component S3A of coating gas stream S3 is generated inside the coating retort R at a location upstream of the inlet I. The yttrium trichloride coating gas stream S3A can be generated by chlorination at high temperatures of a yttrium bed B4 disposed in the retort R. As a result, the chlorination reaction is effected in the CVD reactor retort R itself.

That is, the coating gas stream S3A is generated in the retort R in a separate reaction chamber 92 in which the yttrium bed B4 (yttrium source) is disposed. The yttrium bed B4 comprises turnings having a particle size of greater than ¼ inch to less than ¾ inch. Yttrium trichloride is generated by passing a precursor halide gas stream SP3A comprising an inert/hydrogen carrier gas (e.g. He/H$_2$) and aluminum trichloride through the bed B4 of yttrium particulates maintained at 1080° C. in the retort R.

The precursor gas stream SP3A is generated in a generator housing 100 by flowing a 10 to 15 volume % HCl/15 volume % hydrogen/balance He gas stream SP3 in contact with the heated (290° C.) bed B5 of Al pellets of the type described above to generate aluminum trichloride in a 15 volume % hydrogen/He carrier gas.

The thermodynamic stability of yttrium trichloride is a function of the chlorine pressure in the gas stream SP3A such that to achieve the highest yttrium trichloride concentrations in the retort R, the chlorine partial pressure should be minimized. Low chlorine partial pressures can be achieved by passing a mixture of He/H$_2$ carrier gas and hydrogen chloride through the low temperature aluminum trichloride generator 100 operated under conditions to produce complete conversion of the HCl to AlCl$_3$. Subsequently, the aluminum trichloride and He/H$_2$ carrier gas mixture enters the CVD reactor or retort R via inlet I where it passes through the yttrium bed B4.

Since aluminum chloride is less thermodynamically stable than yttrium trichloride, a portion of the stream SP3A undergoes an exchange reaction which generates yttrium trichloride gas and deposits aluminum metal in the bed B4. The appropriate chemical reaction is given below:

$AlCl_3 + Y = YCl_3 + Al$

Liquid aluminum deposited in the yttrium bed B4 subsequently can react with the yttrium metal to form yttrium-aluminum intermetallic compounds. Some of the yttrium-aluminum compounds can melt at temperatures below 1000° C., resulting in melting of the yttrium chloride generator. The portion of the stream SP3A undergoing the exchange reaction is determined by the flow rate of stream SP3A for a given reaction temperature through bed B4.

The carrier gas used for stream SP3A is selected to include helium or other inert gas plus about 15 volume % hydrogen. This composition of the carrier gas is important and is selected to provide a compromise between two competing processes. Namely, since yttrium forms a pyrophoric hydride by an exothermic reaction, an inert carrier gas is desirable. However, yttrium hydride inhibits the formation of low melting point aluminum-yttrium intermetallic compounds, and consequently prevents melting of the yttrium chloride generator.

Since the conversion of a portion of AlCl$_3$ in coating gas stream SP3A to YCl$_3$ lowers the concentration of AlCl$_3$ therein, there is a need to increase the activity of Al in the unconverted portion of stream SP3A to deposit the desired amount of Al on the substrates S. This is achieved by passing the unconverted portion of the gas stream SP3A through an Al—Cr or Al—Co particulates bed B6 located downstream from the yttrium bed B4 in reaction chamber 94 as shown in FIG. 3. The Al alloy particulates can be comprised of 44 weight % Cr and balance Al and have a size in the range of greater than ¼ inch to less than ⅝ inch. The temperature of the bed B6 is generally the same as that of bed B4.

Passage of the unconverted portion of stream SP3A through the bed B6 of Al—Cr particulates converts aluminum trichloride to aluminum subchlorides that have increased activity compared to the trichloride, resulting in greater deposition of Al on the heated substrates S. The aluminum subchloride gas component S3B and the YCl$_3$ component S3A generated inside the retort R flow in contact with the heated substrates S located thereabove to codeposit Al and Y thereon and form an aluminide diffusion coating including Y distributed uniformly therein.

An alternative coating apparatus to that of FIG. 3 is shown in FIG. 4. In FIG. 4, a coating gas stream S1 (described above with respect to FIG. 1) comprising aluminum trichloride in hydrogen carrier gas is introduced into the retort R downstream of the yttrium bed B4. Introduction of the stream S1 downstream (above) of the Y bed B4 avoids conversion of AlCl$_3$ therein to YCl$_3$. Thus, the need for the bed B6 of Al—Cr particulates is eliminated. The stream SP3A described above with respect to FIG. 3 is supplied to the retort R to generate the necessary YCl$_3$ in generator 92 inside the retort R. The stream S1 and SP3A with YCl$_3$ generated inside the retort R constitute coating gas stream S3' that is flowed in contact with the heated substrates S located thereabove to codeposit Al and Y thereon and form an aluminide diffusion coating including Y distributed uniformly at a particular coating region or throughout the coating.

Because of the pyrophoric nature of yttrium hydride, it is necessary to slowly oxidize the yttrium bed B4 with 1 volume % CO$_2$ in an inert carrier gas stream (not shown) before the CVD reactor or retort R is opened at the end of a coating run.

Aluminide coatings typically having 20 to 25 weight % Al and having a trace of Y distributed therein as determined by electron microprobe analysis have been produced on PWA 1480, Rene 41 and IN738 substrates after 10 to 20 hours at 1080° C. in the retort R and exhibited cyclic oxidation resistance in the aforementioned oxidation test about 2 to 5 times better than simple aluminide coatings.

Figure 5:
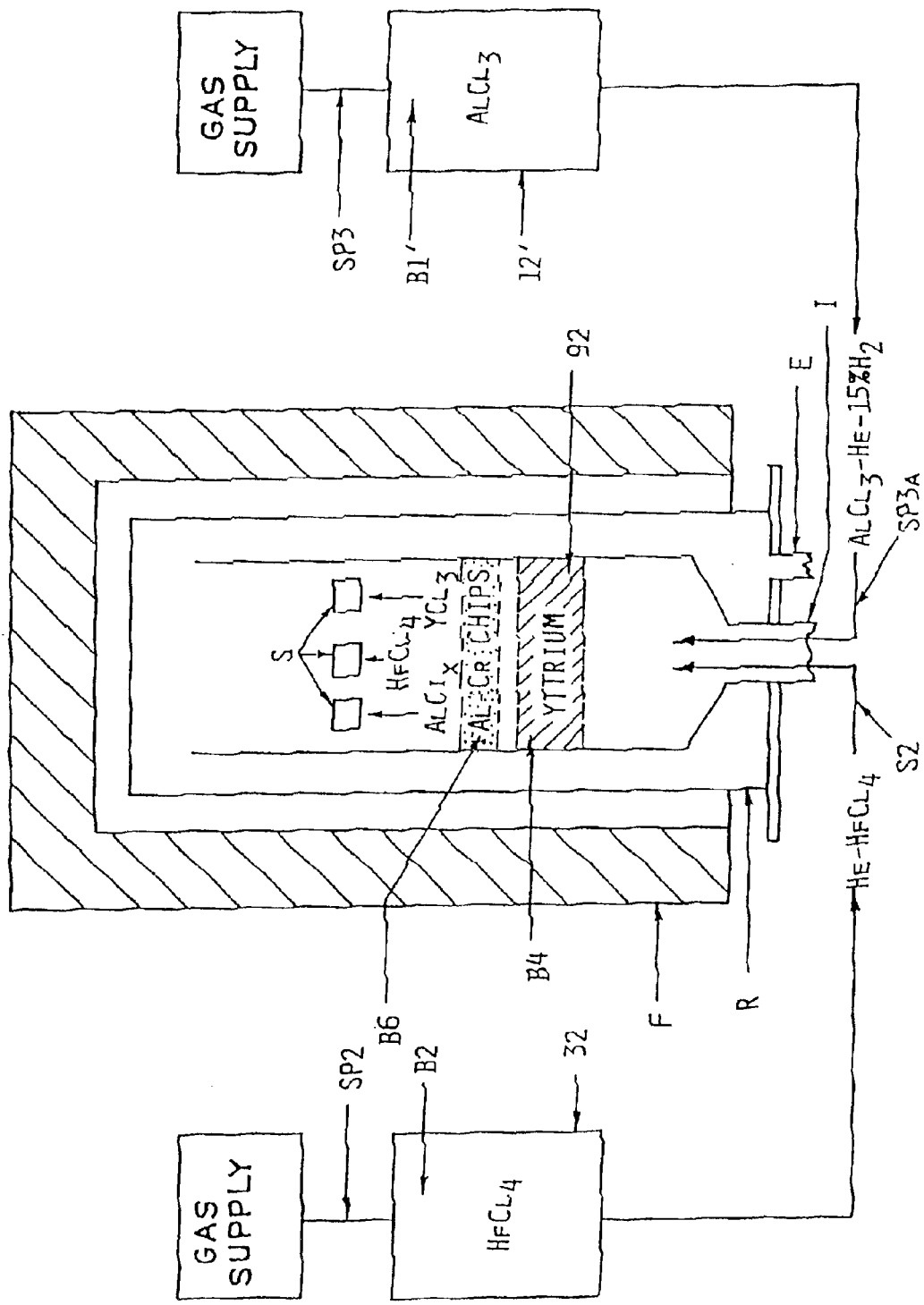
FIG. 5 is a schematic view of CVD coating apparatus similar to that of FIG. 3 for forming an aluminide coating including reactive element (e.g. Hf or Zr) using a coating gas generated by chlorination outside the retort and a second reactive element (e.g. Y) using a coating gas generated by chlorination at higher temperatures inside the retort in accordance with still an additional embodiment of the invention.

Referring to FIG. 5, coating apparatus/method for forming an aluminide coating including two reactive elements are shown. In particular, for purposes of illustration and not limitation, coating apparatus/method are shown to produce a CVD aluminide diffusion coating including Hf and Y on substrates S.

In FIG. 5, the aforementioned stream S2 described above with respect to FIG. 1 and comprising $HfCl_4$ in a He carrier gas is introduced into the retort R via inlet I. Also, the stream SP3A described above with respect to FIGS. 3 and 4 and comprising $AlCl_3$ in a He/hydrogen carrier gas is introduced concurrently into the retort R via inlet I. The streams flow through the yttrium bed B4 and Al—Cr particulates bed B6 like those described with respect to FIG. 3.

In passing through the yttrium bed B4, a portion of the $AlCl_3$ in stream SP3A is converted to $YCl_3$ as described above some $HfCl_4$ in stream S2 is also converted to $YCl_3$ by passage through the yttrium bed B4 as a result of the relative free energies of formation shown in the Table below:

TABLE

| REACTION | FREE ENERGY OF FORMATION PER MOLE OF $Cl_2$ |
|---|---|
| $\frac{2}{3}$ Y + $Cl_2$ = $\frac{2}{3}$ $YCl_3$ | −112,520 cal/mole |
| $\frac{1}{2}$ Hf + $Cl_2$ = $\frac{1}{2}$ $HfCl_4$ | −100,770 cal/mole |
| $\frac{2}{3}$ Al + $Cl_2$ = $\frac{2}{3}$ $AlCl_3$ | −93,818 cal/mole |
| $\frac{1}{2}$ Zr + $Cl_2$ = $\frac{1}{2}$ $ZrCl_4$ | −84,397 cal/mole |
| Cr + $Cl_2$ = $CrCl_2$ | −58,560 cal/mole |
| $\frac{1}{2}$ Si + $Cl_2$ = $\frac{1}{2}$ $SiCl_4$ | −56,705 cal/mole |

As can be seen, $YCl_3$ is more thermodynamically stable than $AlCl_3$ so that a portion of the latter in stream SP3A is converted to $YCl_3$ during flow through the yttrium bed B4. However, $YCl_3$ is only slightly more stable than $HfCl_4$. As a result, a majority of the $HfCl_4$ in stream S2 passes through the bed B4 without conversion to $YCl_3$.

Since a portion of the stream SP3A is converted to $YCl_3$, the unconverted portion thereof is passed through the Al—Cr particulates bed B6 in order to increase the activity of Al in the manner described above with respect to FIG. 3; i.e. by forming aluminum subchlorides ($AlCl_x$). The $HfCl_4$ plus the $AlCl_x$ and $YCl_3$ gas components generated inside the retort R flow in contact with the heated substrates S located thereabove to codeposit Al, Hf and Y thereon and form an aluminide diffusion coating including Hf and Y distributed uniformly at a particular waiting region or throughout the coating for improved oxidation resistance. An aluminide coating was produced on PWA 1480, PWA 1484, Rene 80 and IN 738 substrates using coating apparatus/method of FIG. 5 (13 hours at 1080° C. in retort R) to include 23 weight % Al, 0.22 weight % Hf and 0.015 weight % Y as determined by electron microprobe analysis.

The coating apparatus of FIG. 5 has been used to form aluminide coatings including Zr and Y even though $ZrCl_4$ is slightly less stable than $AlCl_3$ from the Table set forth above. As a result of this reduced stability, a large fraction of the $ZrCl_4$ which enters the yttrium bed B4 is converted to. $YCl_3$. Nonetheless, Al, Zr, and Y can be codeposited on the heated substrates S using the apparatus of FIG. 5, although it is more difficult to predict the Zr concentration in the aluminide coating as compared to the Hf concentration using the same apparatus. An aluminide coating was produced on PWA 1480, PWA 1484, PWA 663, Rene 41, Rene 142, IN 713 and IN 738 substrates using coating apparatus/method of FIG. 5 (13 hours at 1080° C. in retort R) to include 0.18 weight % Zr and 0.265 weight % Y in one trial and 0.11 weight Zr and 0.32 weight % Y in another trial with Al typically being about 23 weight % as determined by electron microprobe analysis.

The aforementioned CVD aluminide coatings including Hf plus Y and Hf plus Zr and Y exhibited a cyclic oxidation resistance about 2 to 5 times better than simple aluminide coatings in the aforementioned oxidation test.

Figure 6:
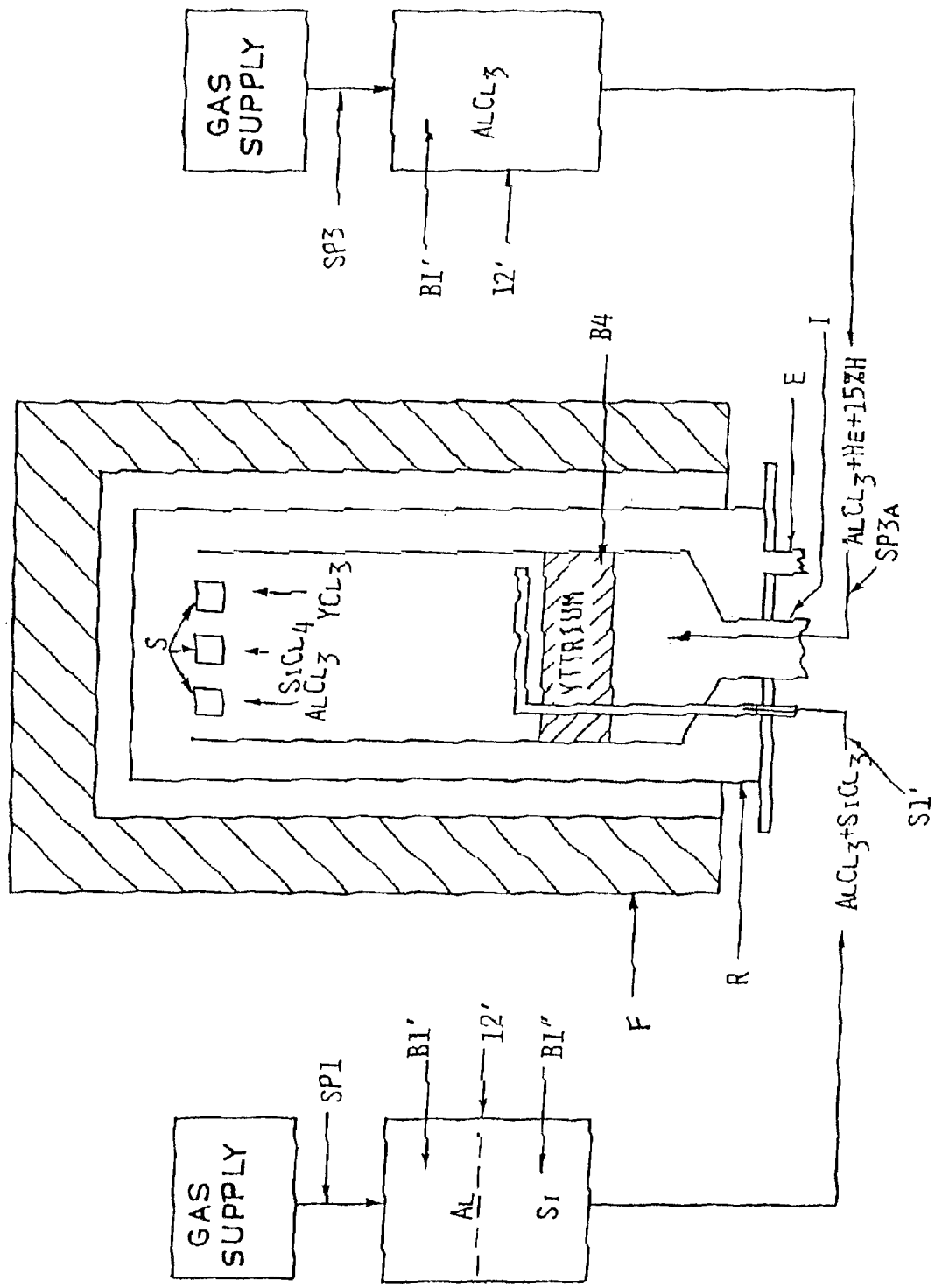
FIG. 6 is a schematic view of CVD coating apparatus similar to that of FIG. 4 for forming an aluminide coating including silicon and a reactive element (e.g. Hf) using coating gases generated by chlorination outside the retort and a second reactive element (e.g. Y) using a coating gas generated by chlorination at higher temperatures inside the retort in accordance with still an additional embodiment of the invention.
Figure 7:
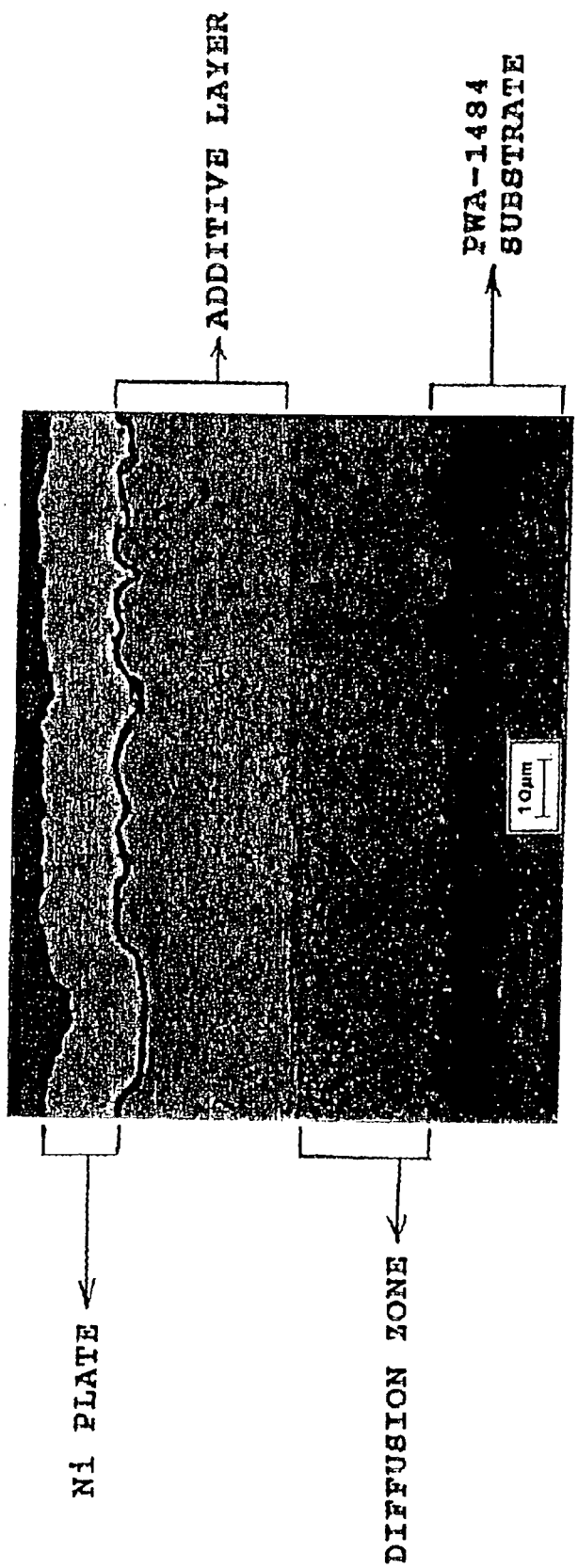
FIG. 7 is a photomicrograph at 1000× of a CVD aluminide coating in accordance with one embodiment of the invention including a uniform dispersion of hafnium-rich particles therein.

Referring to FIG. 6, coating apparatus/method are shown for forming a CVD aluminide coating including Si and Y on substrates S. In particular, the stability of $SiCl_4$ is so much lower than that of $YCl_3$ that nearly all of the $SiCl_4$ which enters the yttrium bed B4 is converted to $YCl_3$. As a result, the aforementioned stream S1' described above with respect to FIG. 2 and comprising cogenerated $AlCl_3$ and $SiCl_4$ in hydrogen carrier gas is introduced into the retort R above (downstream) of the yttrium bed B4 so as not to react therewith. The stream SP3A described above with respect to FIGS. 3 and 4 and comprising $AlCl_3$ in a He/hydrogen carrier gas is introduced into the retort R below the yttrium bed B4 so as to flow through the bed B4 where a portion of the $AlCl_3$ is converted to $YCl_3$ as described with respect to FIGS. 3 and 4. In this way, Al, Si, and Y are continuously codeposited on the heated substrates S to form an aluminide coating including Si and Y uniformly distributed therein. An aluminide coating was produced on PWA 1480, PWA 1484, Rene 41, IN 738, IN 792, Mar-M 247, and GTD-111 substrates using coating apparatus/method of FIG. 6 (4 hours at 1080° C. in retort R) to include less than 1 weight % Si and a trace of % Y with 24 weight % Al as determined by electron microprobe analysis.

The coating gas streams illustrated in FIG. 6 are effective to provide continuous codeposition of aluminum, silicon and yttrium. Since silicon and yttrium form stable intermetallic compounds, it is necessary to provide such continuous deposition on the substrate of silicon to obtain a uniform distribution of silicon and yttrium at a particular region of or throughout the aluminide coating.

For purposes of illustration only, the aforementioned coating gas stream S1' and coating gas stream SP3A were employed for contacting the nickel base superalloy substrates heated to 1080° C. in the CVD retort 60. The flow rate of the coating gas stream S1' was 3 scfh and the flow rate of precursor halide gas stream SP3A was 7 scfh. An aluminide diffusion coating was formed on the substrates after 4 hours and comprised 23 weight % Al, trace levels of Y, less than 1 weight % Si and balance Ni.

CVD aluminide diffusion coatings comprising other compositions have been produced by the invention. For example, CVD nickel aluminide coatings have been produced on Ni base superalloy substrates to include 0.03 weight % Si and 0.1 weight % Y.

CVD aluminide coatings including combinations of Si and one or more of hafnium, zirconium, yttrium, and other gettering elements can be formed by using the apparatus of FIGS. 5 and 6 and combinations thereof. For example, an aluminide coating including Si, Hf or Zr, and Y as coating alloying elements can be formed using the apparatus of FIG. 6 wherein the aforementioned coating gas streams are introduced and/or generated in the retort R.

Thus, the invention provides apparatus and method for continuous CVD codeposition of Al and one or more reactive elements on superalloy and other substrates. The substrates may be treated to include Pt, Pd and other metallic layers or enriched surface zones pursuant to particular coating processes used in the art. The reactive elements can form intermetallic compounds with Si in a uniform distribution at a particular region of or throughout the coating to provide improved coating oxidation resistance.

The present invention thus provides a coated substrate comprising a superalloy or other substrate and a chemically vapor deposited aluminide diffusion coating thereon having a uniform dispersion or distribution of one or more reactive elements therein at a particular coating region or throughout the coating.

Although the invention has been described in terms of certain specific embodiments, it is understood that modifications and changes can be made thereto within the scope of the invention and appended claims.

The embodiments of the invention in which an exclusive property or privilege is claimed are defined as follows:

1. Apparatus for forming a chemical vapor deposition coating gas, comprising means for providing a halide precursor gas, a first source comprising a metal, means for flowing the halide precursor gas in contact with the first source to form a first coating gas, coating retort means, said first source being disposed outside said coating retort means, and means for flowing the first coating gas into the coating retort means in contact with a source of a reactive element disposed inside the coating retort means to convert a portion of the first coating gas to a halide coating gas of the reactive element that contacts a substrate in the coating retort means with the first coating gas to codeposit the metal and the reactive element on the substrate.

2. The apparatus of claim 1 including a secondary source of the metal upstream of the reactive element source in the coating retort means for contacting an unconverted portion of the first coating gas.

3. The apparatus of claim 2 including means for introducing another metal halide coating gas into the coating retort means upstream of the reactive element source to codeposit said another metal along with said metal and the reactive element on the substrate.

4. The apparatus of claim 1 wherein said source of said reactive element comprises particulates comprising at least one of Hf, Zr, Si, and Y.

5. Apparatus for forming a chemical vapor deposition coating gas, comprising means for providing a halide precursor gas, means for flowing the halide precursor gas in contact with a first source comprising a metal to form a first coating gas, coating retort means, means for flowing the first coating gas into the coating retort means in contact with a source of a reactive element disposed inside the coating retort means to convert a portion of the first coating gas to a halide coating gas of the reactive element, and a secondary source of said metal disposed upstream of said source of said reactive element in the coating retort means to contact an unconverted portion of the first coating gas.

6. The apparatus of claim 5 wherein said source of said reactive element comprises particulates comprising at least one of Hf, Zr, Si, and Y.

7. Apparatus for forming a chemical vapor deposition coating gas, comprising means for providing a halide precursor gas, a first source comprising aluminum, means for flowing the halide precursor gas in contact with the first source to form a first coating gas comprising aluminum halide, a coating retort, said first source being disposed outside said coating retort, and means for flowing the first coating gas into the coating retort in contact with a source of a reactive element disposed inside the coating retort to convert a portion of the first coating gas to a halide coating gas of the reactive element.

8. The apparatus of claim 7 including a secondary source comprising aluminum inside the coating retort means upstream of the reactive element source for contacting an unconverted portion of the first coating gas.

9. The apparatus of claim 8 including means for introducing another metal halide coating gas into the coating retort upstream of the reactive element source.

10. The apparatus of claim 8 wherein said source of said reactive element comprises particulates comprising at least one of Hf, Zr, Si, and Y.

* * * * *